United States Patent
Hwang et al.

(10) Patent No.: US 12,519,063 B2
(45) Date of Patent: Jan. 6, 2026

(54) DOUBLE-SIDED COOLING POWER MODULE INCLUDING REVERSE-MOUNTED CHIPS

(71) Applicants: Hyundai Motor Company, Seoul (KR); Kia Corporation, Seoul (KR)

(72) Inventors: Sung Taek Hwang, Whasung-Si (KR); So Eun Jeong, Whasung-Si (KR); Jun Hee Park, Whasung-Si (KR); Nam Sik Kong, Whasung-Si (KR)

(73) Assignees: Hyundai Motor Company, Seoul (KR); Kia Corporation, Seoul (KR)

(*) Notice: Subject to any disclaimer, the term of this patent is extended or adjusted under 35 U.S.C. 154(b) by 378 days.

(21) Appl. No.: 18/134,437

(22) Filed: Apr. 13, 2023

(65) Prior Publication Data

US 2024/0136296 A1 Apr. 25, 2024
US 2024/0234327 A9 Jul. 11, 2024

(30) Foreign Application Priority Data

Oct. 24, 2022 (KR) .......................... 10-2022-0137541

(51) Int. Cl.
*H01L 23/538* (2006.01)
*H01L 25/07* (2006.01)

(52) U.S. Cl.
CPC ...... *H01L 23/5385* (2013.01); *H01L 23/5387* (2013.01); *H01L 25/071* (2013.01)

(58) Field of Classification Search
CPC . H01L 23/5385; H01L 23/5389; H05K 1/145; H05K 1/111
USPC .......................................................... 257/773
See application file for complete search history.

(56) References Cited

U.S. PATENT DOCUMENTS

2014/0159212 A1* 6/2014 Hung .................. H01L 23/3135
257/666

FOREIGN PATENT DOCUMENTS

KR 10-2024-0083593 6/2024

* cited by examiner

*Primary Examiner* — Quoc D Hoang
(74) *Attorney, Agent, or Firm* — Morgan Lewis & Bockius LLP

(57) ABSTRACT

A power module includes an upper substrate and a lower substrate, an upper chip, a lower chip, and a circuit board disposed across a space between the upper substrate and the lower chip and a space between the lower substrate and the upper chip so that the upper substrate and the lower substrate are vertically spaced from each other. The circuit board electrically connects the upper chip to the lower substrate while electrically connecting the lower chip to the upper substrate.

14 Claims, 4 Drawing Sheets

DOUBLE-SIDED COOLING POWER MODULE INCLUDING REVERSE-MOUNTED CHIPS

CROSS-REFERENCE TO RELATED APPLICATION

The present application claims priority to Korean Patent Application No. 10-2022-0137541, filed Oct. 24, 2022, the entire contents of which is incorporated herein for all purposes by this reference.

BACKGROUND OF THE PRESENT DISCLOSURE

Field of the Present Disclosure

The present disclosure relates to a power module, and more to a power module configured for securing processability while enhancing heat dissipation performance.

Description of Related Art

In pace with recently increased interest in the environment, eco-friendly vehicles provided with an electric motor as a driving source are being highlighted. Such an eco-friendly vehicle is also called an "electrified vehicle". As representative examples of electrified vehicles, there are an electric vehicle (EV) and a hybrid electric vehicle (HEV).

Such an electrified vehicle is provided with an inverter configured to convert DC power into AC power in driving of a motor. Typically, the inverter includes a single power module or a plurality of power modules including a semiconductor chip configured to perform a switching function.

Meanwhile, the semiconductor chip of the power module inherently generates heat because a large current of a high voltage flows therethrough during operation thereof. For stable operation of the power module, it is necessary to eliminate generation of heat. In connection with this, various schemes have been provided.

Power modules may be classified into those of a single-sided cooling type and a double-sided cooling type in accordance with kinds of cooling methods. In a single-sided cooling type power module, heat generated from a chip is transferred to only one of substrates. In a double-sided cooling type power module, however, heat generated from a chip is transferred to both an upper substrate and a lower substrate in a distributed manner, and, accordingly, the heat dissipation load of each substrate may be reduced.

However, it is more difficult to achieve balanced adjustment of a heat dissipation ratio between the upper substrate and the lower substrate, due to appearance of a high performance chip and a tendency of the chip toward a reduction in area. Furthermore, when a high heat dissipation material is used for an enhancement in heat dissipation performance, an increase in cost occurs, and accordingly, degradation in marketability may occur.

Therefore, a scheme capable of efficiently enhancing the heat dissipation performance of a power module to which double-sided cooling is applied is needed.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a power module configured for securing processability while enhancing heat dissipation performance by disposing chips at an upper substrate and a lower substrate, respectively, and vertically spacing the upper substrate and the lower substrate apart from each other by a circuit board electrically connected to the chips.

It will be appreciated by persons skilled in the art to which the present disclosure pertains that technical problems to be solved by the present disclosure are not limited to the above-described technical problems, and other technical problems will be more clearly understood from the following description.

In accordance with an aspect of the present disclosure, the above and other objects may be accomplished by the provision of a power module including an upper substrate and a lower substrate, an upper chip disposed at a lower surface of the upper substrate, a lower chip disposed at an upper surface of the lower substrate, and a circuit board disposed across a space between the upper substrate and the lower chip and a space between the lower substrate and the upper chip so that the upper substrate and the lower substrate are vertically spaced from each other, the circuit board electrically connecting the upper chip to the lower substrate while electrically connecting the lower chip to the upper substrate.

The upper chip may include a first power pad and a first signal pad disposed at a lower surface of the upper chip. The lower chip may include a second power pad and a second signal pad disposed at an upper surface of the lower chip.

The upper chip and the lower chip are horizontally spaced from each other, not to overlap each other in plan view.

The first signal pad and the second signal pad are disposed adjacent to each other.

The circuit board may include an insulating plate, a first power conductor extending vertically through the insulating plate and electrically interconnecting the first power pad and the lower substrate, and a second power conductor extending vertically through the insulating plate and electrically interconnecting the second power pad and the upper substrate.

The circuit board may further include a first signal conductor buried in the insulating plate at at least a portion thereof and electrically connected to the first signal pad, and a second signal conductor buried in the insulating plate at at least a portion thereof and electrically connected to the second signal pad.

The circuit board may further include a signal connector configured to receive a voltage from an exterior thereof and electrically connected to the first signal conductor and the second signal conductor.

The insulating plate may include a first insulating plate, and a second insulating plate horizontally spaced from the first insulating plate. The first power conductor and the first signal conductor may be disposed at the first insulating plate. The second power conductor and the second signal conductor may be disposed at the second insulating plate.

The circuit board may further include a flexible substrate disposed between the first insulating plate and the second insulating plate.

The first signal conductor and the second signal conductor may be electrically connected to the flexible substrate.

A thickness of the flexible substrate may be smaller than a thickness of the insulating plate.

The circuit board may further include a signal connector configured to receive a voltage from an exterior thereof and electrically connected to the first signal conductor and the second signal conductor. The signal connector may be disposed at an end portion of the flexible substrate.

Thicknesses of the first insulating plate and the second insulating plate may be equal.

A vertical position deviation between the first insulating plate and the second insulating plate may correspond to a thickness of each chip.

A thickness of the insulating plate may be equal to a thickness of each of the first power conductor and the second power conductor.

In accordance with various exemplary embodiments of the present disclosure as described above, a chip reverse structure may be effectively realized through a circuit board disposed between an upper substrate and a lower substrate.

Through such a chip reverse structure, heat generated from chips may be transferred to the upper substrate and the lower substrate in a distributed manner, and accordingly, double-sided cooling efficiency may be enhanced.

Furthermore, a degree of heat overlap between the upper substrate and the lower substrate may be reduced, and, accordingly, the distance between the chips may be further reduced. Accordingly, it may be possible to reduce the size of the entirety of the power module or to mount an increased number of chips in the same area, and accordingly, to enhance an output density of the power module.

Furthermore, wire bonding may be omitted through a circuit board electrically connected to the upper substrate, the lower substrate, and the chips. Accordingly, patterns of the upper substrate and the lower substrate may be simplified, and accordingly, an additional heat dissipation area may be secured.

Furthermore, through the structure of the circuit board, uniform pressing may be possible, and gaps in an interior of the module may be additionally secured. Accordingly, an enhancement in processability may be achieved.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinafter, exemplary embodiments of the present disclosure will be described in detail with reference to the accompanying drawings, and the same or similar elements are designated by the same reference numerals regardless of the numerals in the drawings and redundant description thereof will be omitted. The suffixes "module" and "unit" of elements herein are used for convenience of description and thus may be used interchangeably and do not have any distinguishable meanings or functions. In describing the present disclosure, moreover, the detailed description will be omitted when a specific description of publicly known technologies to which the present disclosure pertains is judged to obscure the gist of the present disclosure. Furthermore, it should be noted that the accompanying drawings are merely illustrated to easily explain the spirit of the present disclosure, and therefore, should not be construed as limiting the spirit of the present disclosure to the accompanying drawings. On the other hand, the present disclosure is to cover all modifications, equivalents, and alternatives falling within the spirit and scope of the present disclosure as defined by the claims.

In the meantime, although terms including an ordinal number, such as first or second, may be used to describe a variety of constituent elements, the constituent elements are not limited to the terms, and the terms are used only for discriminating one constituent element from other constituent elements.

It will be understood that when one element is referred to as being "connected to" or "coupled to" another element, one element may be "connected to" or "coupled to" another element via a further element although one element may be directly connected to or directly coupled to another element. On the other hand, it will be understood that, when an element is referred to as being "directly connected to" or "directly coupled to" another element, there is no intervening element present.

As used in the description of the present disclosure and the appended claims, the singular forms are intended to include the plural forms as well, unless context clearly indicates otherwise.

It will be further understood that the terms "comprises" and/or "comprising," or "includes" and/or "including" when used in the present specification, specify the presence of stated features, regions, integers, steps, operations, elements, and/or combinations thereof, but do not preclude the presence or addition of one or more other features, regions, integers, steps, operations, elements, components, and/or combinations thereof.

An exemplary embodiment of the present disclosure proposes a power module in which chips are disposed at one-side surfaces of an upper substrate and a lower substrate, respectively, and the upper substrate and the lower substrate are spaced from each other by a circuit board provided with a plurality of circuit lines forming a pattern configured to electrically interconnect the chips, being capable of enhancing thermal performance and processability.

Meanwhile, a concept of thermal resistance may be used as a thermal performance indicator of the power module. Thermal resistance is a value determined by disposition of parts and characteristics of materials. When thermal resistance is lowered, efficiency of dissipation of heat generated from a chip is enhanced.

Furthermore, thermal performance is enhanced when an increased heat dissipation area of the power module is secured. Security of a heat dissipation area allows expansion of a selection range of a structure or a material of the power module, and accordingly, influences the power module in terms of size and price.

Meanwhile, a heat dissipation angle is determined in accordance with characteristics of a material applied to the power module. When the heat dissipation angle is constant, the heat dissipation area is increased as the thickness of the material increases, and accordingly, an enhancement in thermal performance may be achieved.

Hereinafter, a configuration and a structure of a power module enhanced in thermal performance and processability according to an exemplary embodiment of the present disclosure will be described with reference to FIG. 1 and FIG. 2.

Figure 1:
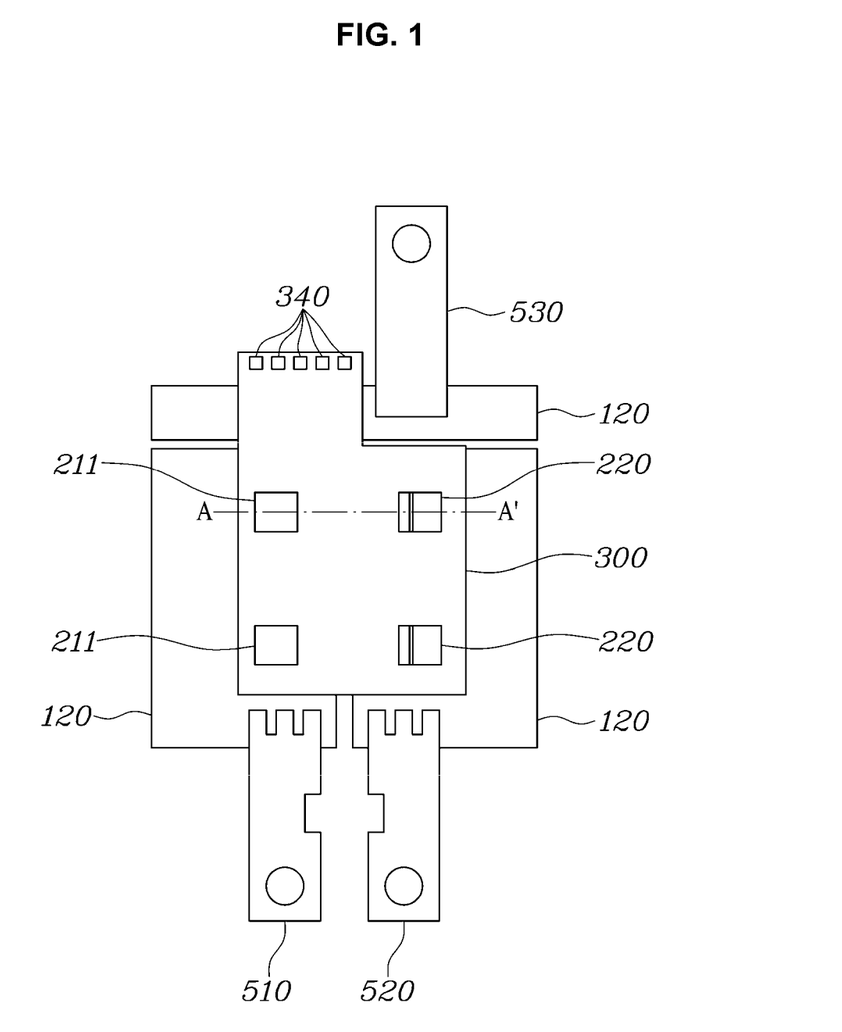
FIG. 1 is a plan view of a power module according to an exemplary embodiment of the present disclosure.

FIG. 1 is a plan view of the power module according to the exemplary embodiment of the present disclosure. FIG. 2 is a cross-sectional view of the power module taken along line A-A' in FIG. 1.

Figure 2:
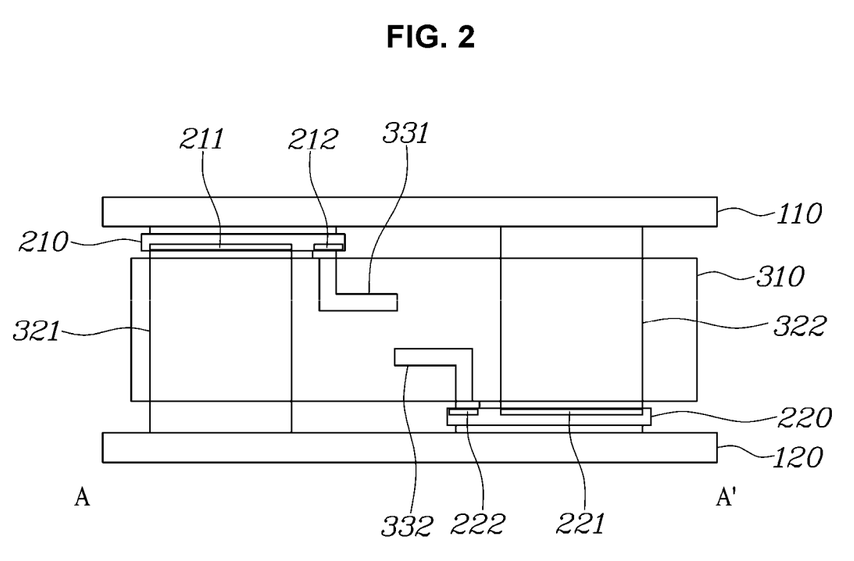
FIG. 2 is a cross-sectional view of the power module taken along line A-A' in FIG. 1.

Referring to FIG. 1 and FIG. 2, the power module according to the exemplary embodiment of the present disclosure may include an upper substrate 110, a lower substrate 120, an upper chip 210, a lower chip 220, a circuit board 300, and a power lead 500. Although FIG. 1 and FIG. 2 mainly show constituent elements associated with the present disclosure, the power module actually includes a greater or smaller number of constituent elements than that of the shown case. Hereinafter, respective constituent elements will be described.

First, when viewed in FIG. 2, the upper substrate 110 is a substrate provided at an upper portion of the power module, and the lower substrate 120 is a substrate provided at a lower portion of the power module.

Each of the upper substrate 110 and the lower substrate 120 may include at least one metal layer. A plurality of circuit lines may be provided at the metal layer, and accordingly, a pattern configured to form an electrical connection relation between an interior and an exterior of the power module may be embodied in the metal layer.

Furthermore, each of the upper substrate 110 and the lower substrate 120 may include an insulating layer. The insulating layer is configured to electrically isolate the interior and the exterior of the power module from each other. A metal layer may be disposed at one surface or both surfaces of the insulating layer.

Furthermore, when metal layers are disposed at both surfaces of the insulating layer, respectively, the metal layer disposed at an outside of the power module may receive heat generated from the chip, and may dissipate the heat through heat exchange with an exterior thereof.

Furthermore, a cooling channel may be additionally provided at the outside of the power module to achieve more effective heat dissipation. The cooling channel may be configured to be, for example, an air cooling type or a water cooling type, and may enhance cooling efficiency thereof through a refrigerant.

Furthermore, the metal layers of the upper substrate 110 and the lower substrate 120 may be made of, for example, copper (Cu). The insulating layers of the upper substrate 110 and the lower substrate 120 may be made of a ceramic. In accordance with bonding methods, each of the upper substrate 110 and the lower substrate 120 may be embodied as an active metal brazed (AMB) substrate or a direct bonded copper (DBC) substrate.

Meanwhile, the upper chip 210 may be disposed at a lower surface of the upper substrate 110, and the lower chip 220 may be disposed at an upper surface of the lower substrate 120. Accordingly, each of the upper chip 210 and the lower chip 220 may be disposed to face an interior of the power module. The upper chip 210 and the lower chip 220 may also be collectively referred to as "chips".

A first power pad 211 and a first signal pad 212 may be disposed at a lower surface of the upper chip 210, and a second power pad 221 and a second signal pad 222 may be disposed at an upper surface of the lower chip 220 (that is, reverse disposition).

The upper chip 210 and the lower chip 220 may be turned on/off in accordance with whether or not a voltage is input to the signal pads 212 and 222, respectively. When the chips are turned on, facing surfaces thereof may be electrically interconnected, and accordingly, current may flow through the power pads 211 and 221. On the other hand, when the chips are turned off, the facing surfaces thereof may be electrically isolated from each other, and accordingly, current cannot flow.

Meanwhile, each chip may be, for example, a switching device such as an insulated gate bipolar transistor (IGBT), a metal-oxide-semiconductor field-effect transistor (MOSFET), or the like.

Furthermore, as a material of each chip, silicon (Si) or silicon carbide (SiC) may be employed. When a silicon carbide chip (referred to as an "SiC chip" in the following description, for convenience of description) is employed, it may be possible to enhance energy efficiency or to reduce the volume or weight of the power module, as compared to the case in which a silicon chip (referred to as an "Si chip" in the following description, for convenience of description) is employed.

When the SiC chip is employed, the area of the chip may be reduced, and an amount of heat generated from the chip may be increased. For the present reason, it is difficult to uniformly distribute the generated heat to the upper substrate 110 and the lower substrate 120. In the instant case, a binder configured for sustaining a high temperature environment may be required.

In the instant case, heat generated from the upper chip 210 may be mainly transferred to the upper substrate 110, and heat generated from the lower chip 220 may be mainly transferred to the lower substrate 120. Accordingly, heat generated in the interior of the power module may be more uniformly transferred to the upper substrate 110 and the lower substrate 120 irrespective of a vertical heat distribution ratio with reference to the chips.

Furthermore, as the generated heat is transferred to upper and lower portions of the power module in an appropriately distributed manner, a heat overlap area of the upper and lower substrates 110 and 120 (hereinafter, also collectively referred to as "upper/lower substrates 100") may be reduced. As the heat overlap area is reduced, the horizontal distance between the chips may be reduced. Accordingly, an increased number of chips may be disposed within the same area, and accordingly, an output of the power module may be enhanced.

Meanwhile, the upper chip 210 and the lower chip 220 may be spaced from each other not only in a vertical direction, but also in a horizontal direction, as shown in FIG. 2, and accordingly, may be disposed not to overlap each other in plan view.

Furthermore, the upper chip 210 and the lower chip 220 may be disposed so that the signal pads 212 and 222 thereof are disposed adjacent to each other. That is, as shown in FIG. 2, the upper chip 210 and the lower chip 220 may be disposed in point symmetry with reference to a center portion of the entirety of the power module.

As the first signal pad 212 and the second signal pad 222 are disposed to be adjacent to each other, signals of the chips may be centrally processed at once. Accordingly, an electrical connection relation in the interior of the power module may be more concisely formed. As a result, it may be possible to enhance freedom of design of the power module or to reduce the size of the power module.

Furthermore, the upper chip 210 and the lower chip 220 may be bonded to the upper substrate 110 and the lower substrate 120, respectively, through a sintering process. When the sintering process is employed, bonding maintenance may be further enhanced even in a high temperature environment.

Meanwhile, the circuit board 300 is disposed across a space between the upper substrate 110 and the lower chip 220 and a space between the lower substrate 120 and the upper chip 210 so that the upper substrate 110 and the lower substrate 120 are vertically spaced from each other.

In a structure of a double-sided cooling type power module, an upper substrate and a lower substrate thereof are spaced from each other so that an internal space is secured therebetween, and a spacer or the like may be used for electrical connection between upper and lower portions of the power module. In the exemplary embodiment of the present disclosure, however, disposition of a separate configuration such as a spacer or the like may be omitted through disposition of the circuit board 300 as described above. Furthermore, the circuit board 300 may electrically interconnect the upper chip 210 and the lower substrate 120 while electrically interconnecting the lower chip 220 and the upper substrate 110.

Furthermore, the circuit board 300 may include a first power conductor 321 extending vertically through an insulating plate 310 and electrically interconnecting the first power pad 211 and the lower substrate 210, and a second power conductor 322 extending vertically through the insulating plate 310 and electrically interconnecting the second power pad 221 and the upper substrate 110.

Through the present configuration, current may flow in a vertical direction between the upper/lower substrates 100 and the chips.

Furthermore, the thickness of the insulating plate 310 may be equal to the thickness of each of the first power conductor 321 and the second power conductor 322.

Furthermore, the circuit board 300 may further include a first signal conductor 331 buried in the insulating plate 310 at at least a portion thereof and electrically connected to the first signal pad 212, and a second signal conductor 332 buried in the insulating plate 310 at at least a portion thereof and electrically connected to the second signal pad 222.

Through the present configuration, it is unnecessary to separately interconnect the chips and the upper/lower substrates 100 using wire bonding or the like. Accordingly, signal patterns of the upper/lower substrates 100 for interconnection between the upper/lower substrates 100 and the chips may be omitted, and accordingly, pattern simplification may be achieved, and an additional heat dissipation area may be correspondingly secured.

Meanwhile, the circuit board 300 may be embodied as a printed circuit board (PCB).

Meanwhile, the circuit board 300 may further include a signal connector 340 configured to receive a voltage from an exterior thereof and electrically connected to the first signal conductor 331 and the second signal conductor 332. The voltage input to the signal connector 340 may be transferred to the signal pads 212 and 222 of the chips via the circuit board 300.

Meanwhile, the power module according to the exemplary embodiment of the present disclosure may further include a plurality of power leads 510, 520 and 530 connected to the chips via at least one of the upper substrate 110 and the lower substrate 120. Current is input to or output from the plurality of power leads 510, 520 and 530. The plurality of power leads 510, 520 and 530 may function as a (+) terminal, a (−) terminal, and an output terminal, respectively.

Heretofore, the entire structure of the power module according to the exemplary embodiment of the present disclosure has been described with reference to FIG. 1 and FIG. 2. In the following description, a configuration of a power module according to another exemplary embodiment of the present disclosure will be described in detail with reference to FIG. 3 and FIG. 4.

Figure 3:
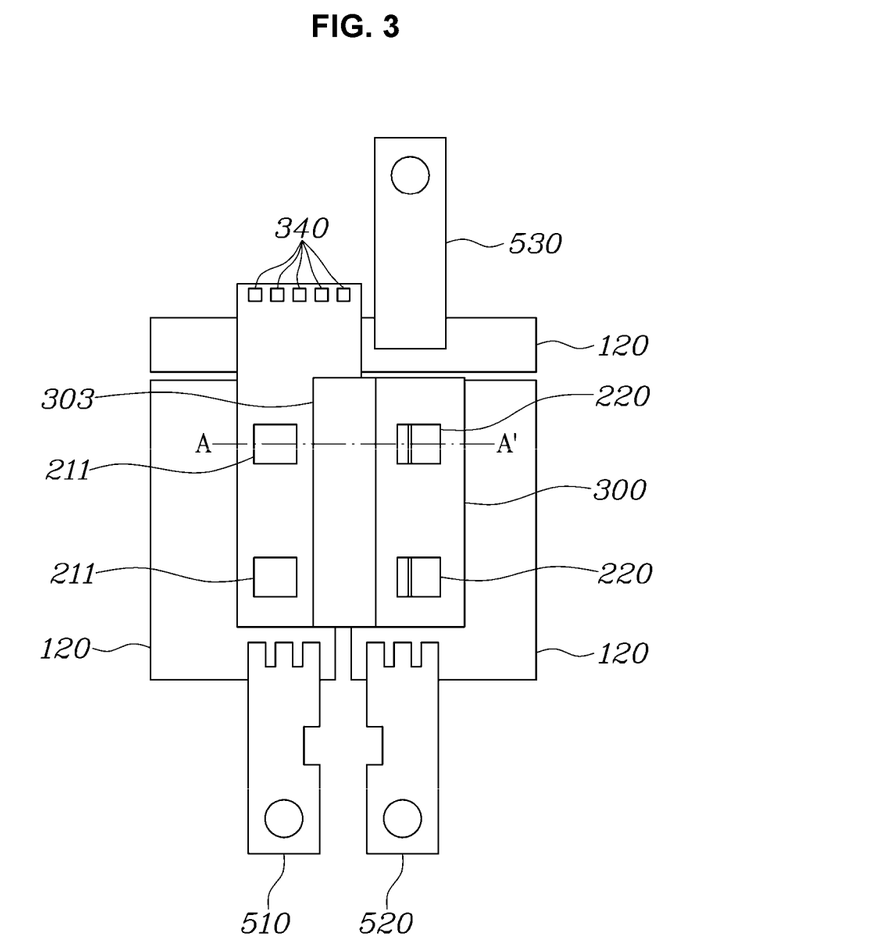
FIG. 3 is a plan view of a power module according to another exemplary embodiment of the present disclosure.
Figure 4:
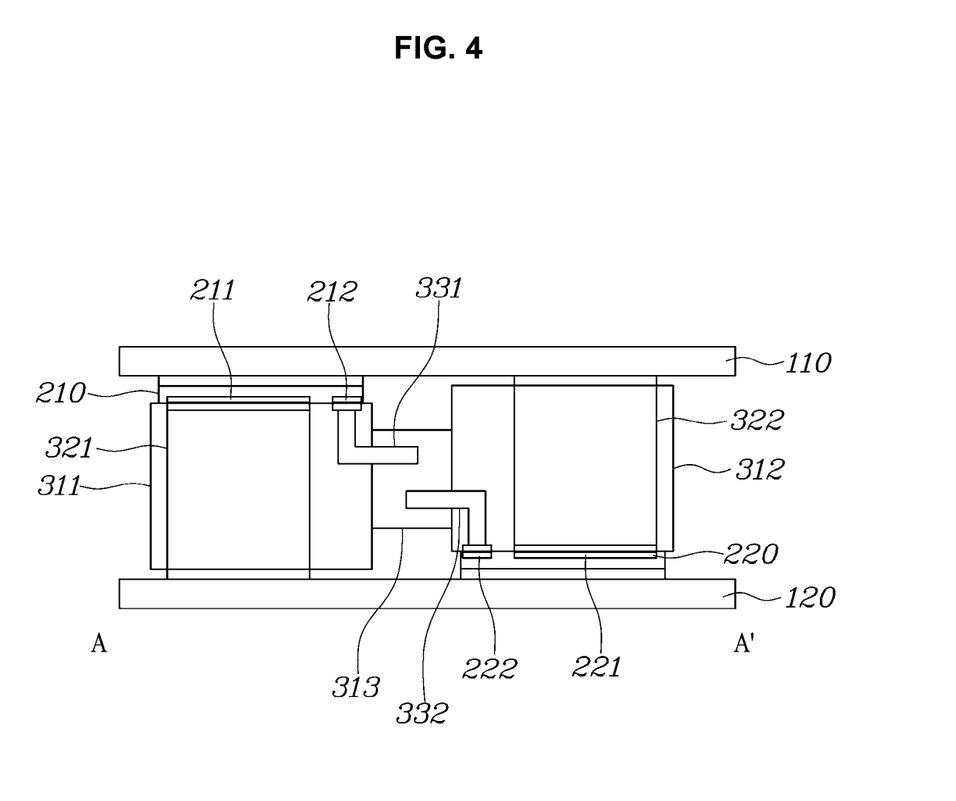
FIG. 4 is a cross-sectional view of the power module taken along line A-A' in FIG. 3.

FIG. 3 is a plan view of a power module according to another exemplary embodiment of the present disclosure. FIG. 4 is a cross-sectional view of the power module taken along line A-A' in FIG. 3. Referring to FIG. 3 and FIG. 4, an insulating plate 310 may include a first insulating plate 311, and a second insulating plate 312 disposed to be horizontally spaced from the first insulating plate 311.

In the instant case, a first power conductor 321 and a first signal conductor 331 may be disposed at the first insulating plate 311, and a second power conductor 322 and a second signal conductor 332 may be disposed at the second insulating plate 312.

Furthermore, a circuit board 300 may further include a flexible substrate 313 disposed between the first insulating plate 311 and the second insulating plate 312.

For example, the first insulating plate 311 and the second insulating plate 312 may be embodied as a general PCB, and the flexible substrate 313 may be embodied as a flexible printed circuit board (FPCB). In the instant case, the circuit board 300 may be embodied as a rigid flexible printed circuit board (RFPCB) to which a general PCB and an FPCB are connected.

As the flexible substrate 313 has characteristics as described above, the flexible substrate 313 may be flexibly deformable, and, accordingly, the structure of the circuit board 300 may be more freely variable.

Furthermore, the flexible substrate 313 may be electrically connected to the first signal conductor 331 and the second signal conductor 332.

Meanwhile, the thickness of the flexible substrate 313 may be smaller than the thicknesses of the first insulating plate 311 and the second insulating plate 312. Gaps may be secured at upper and lower portions of the circuit board 300 in accordance with a reduction in thickness, respectively. Flowability of a molding material may be enhanced through the additionally secured gaps, and accordingly, it may be possible to enhance convenience of injection of the molding material and to reduce a failure rate of a molding process.

Furthermore, when the first signal conductor 331 and the second signal conductor 332 are connected to the flexible substrate 313, a signal connector 340 may be embodied as a connector disposed at an end portion of the flexible substrate 313.

Meanwhile, the first insulating plate 311 and the second insulating plate 312 may have the same thickness.

Furthermore, a vertical position deviation between the first insulating plate 311 and the second insulating plate 312 may correspond to the thickness of each chip. That is, as shown in FIG. 4, the upper substrate 110 and the lower substrate 120 may be stacked in parallel as the first insulating plate 311 and the second insulating plate 312 are formed to have the same thickness, and the vertical position deviation therebetween corresponds to the thickness of each chip.

Furthermore, the thickness deviation of the chips disposed between the upper substrate 110 and the lower substrate 120 may be reduced through the above described configuration. Accordingly, a uniform pressure may be applied to bonding surfaces during pressing in a bonding process, and accordingly, bonding reliability may be secured.

As apparent from the above description, in accordance with various exemplary embodiments of the present disclosure as described above, a chip reverse structure may be effectively realized through a circuit board disposed between an upper substrate and a lower substrate.

Through such a chip reverse structure, heat generated from chips may be transferred to the upper substrate and the lower substrate in a distributed manner, and accordingly, double-sided cooling efficiency may be enhanced.

Furthermore, a degree of heat overlap between the upper substrate and the lower substrate may be reduced, and, accordingly, the distance between the chips may be further reduced. Accordingly, it may be possible to reduce the size of the entirety of the power module or to mount an increased number of chips in the same area, and accordingly, to enhance an output density of the power module.

Furthermore, wire bonding may be omitted through a circuit board electrically connected to the upper substrate, the lower substrate, and the chips. Accordingly, patterns of the upper substrate and the lower substrate may be simplified, and accordingly, an additional heat dissipation area may be secured.

Furthermore, through the structure of the circuit board, uniform pressing may be possible, and gaps in an interior of the module may be additionally secured. Accordingly, an enhancement in processability may be achieved.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A power module comprising:
   an upper substrate and a lower substrate;
   an upper chip disposed at a lower surface of the upper substrate;
   a lower chip disposed at an upper surface of the lower substrate; and
   a circuit board disposed across a space between the upper substrate and the lower chip and a space between the lower substrate and the upper chip so that the upper substrate and the lower substrate are vertically spaced from each other, and electrically connecting the upper chip to the lower substrate while electrically connecting the lower chip to the upper substrate,
   wherein the upper chip includes a first power pad and a first signal pad disposed at a lower surface of the upper chip, and
   wherein the lower chip includes a second power pad and a second signal pad disposed at an upper surface of the lower chip.

2. The power module of claim 1, wherein the upper chip and the lower chip are horizontally spaced from each other, not to overlap each other in plan view.

3. The power module of claim 2, wherein the first signal pad and the second signal pad are disposed adjacent to each other.

4. The power module of claim 1, wherein the circuit board includes:
   an insulating plate;
   a first power conductor extending vertically through the insulating plate and electrically interconnecting the first power pad and the lower substrate; and
   a second power conductor extending vertically through the insulating plate and electrically interconnecting the second power pad and the upper substrate.

5. The power module of claim 4, wherein the circuit board further includes:
   a first signal conductor buried in the insulating plate at at least a portion thereof and electrically connected to the first signal pad; and
   a second signal conductor buried in the insulating plate at at least a portion thereof and electrically connected to the second signal pad.

6. The power module of claim 5, wherein the circuit board further includes a signal connector configured to receive a voltage from an exterior thereof and electrically connected to the first signal conductor and the second signal conductor.

7. The power module of claim 5,
   wherein the insulating plate includes a first insulating plate, and a second insulating plate horizontally spaced from the first insulating plate,
   wherein the first power conductor and the first signal conductor are disposed at the first insulating plate, and
   wherein the second power conductor and the second signal conductor are disposed at the second insulating plate.

8. The power module of claim 7, wherein the circuit board further includes a flexible substrate disposed between the first insulating plate and the second insulating plate.

9. The power module of claim 8, wherein the first signal conductor and the second signal conductor are electrically connected to the flexible substrate.

10. The power module of claim 8, wherein a thickness of the flexible substrate is smaller than a thickness of the insulating plate.

11. The power module of claim 8,
wherein the circuit board further includes a signal connector configured to receive a voltage from an exterior thereof and electrically connected to the first signal conductor and the second signal conductor, and
wherein the signal connector is disposed at an end portion of the flexible substrate.

12. The power module of claim 7, wherein thicknesses of the first insulating plate and the second insulating plate are equal.

13. The power module of claim 7, wherein a vertical position deviation between the first insulating plate and the second insulating plate corresponds to a thickness of the upper chip or the lower chip.

14. The power module of claim 4, wherein a thickness of the insulating plate is equal to a thickness of each of the first power conductor and the second power conductor.

* * * * *